United States Patent
Willmot et al.

(10) Patent No.: US 9,253,870 B2
(45) Date of Patent: Feb. 2, 2016

(54) FIRE RESISTANT ELECTRICAL PANEL

(71) Applicant: ROLLS-ROYCE PLC, London (GB)

(72) Inventors: Michael Christopher Willmot, Sheffield (GB); Alec Michael Georgala, London (GB); Martin Anthony James Emery, Bristol (GB)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 14/711,248

(22) Filed: May 13, 2015

(65) Prior Publication Data

US 2015/0342022 A1 Nov. 26, 2015

(30) Foreign Application Priority Data

May 23, 2014 (GB) .................................. 1409189.6

(51) Int. Cl.
| | |
|---|---|
| *H05K 1/00* | (2006.01) |
| *H05K 1/02* | (2006.01) |
| *F02C 7/25* | (2006.01) |
| *H05K 3/46* | (2006.01) |
| *H05K 3/10* | (2006.01) |

(52) U.S. Cl.
CPC ................ *H05K 1/0201* (2013.01); *F02C 7/25* (2013.01); *H05K 3/10* (2013.01); *H05K 3/46* (2013.01); *H05K 2203/1147* (2013.01); *Y10T 29/49119* (2015.01)

(58) Field of Classification Search
CPC ............ A62C 2/00; A62C 2/06; A62C 2/065; A62C 3/00; A62C 3/002; G02B 6/44; E04B 1/78; E04B 1/94; B32B 5/00; B32B 5/02
USPC .................. 174/250; 220/22, 62; 52/232, 393, 52/407.1, 741.3; 428/36.9, 102, 139, 179; 385/128; 442/139, 141; 169/48
See application file for complete search history.

(56) References Cited

U.S. PATENT DOCUMENTS

| | | | | |
|---|---|---|---|---|
| 4,849,273 A | * | 7/1989 | Skinner ..................... | B23K 9/32 428/102 |
| 4,889,400 A | * | 12/1989 | Pinson .................. | G02B 6/4436 385/128 |
| 5,984,126 A | * | 11/1999 | Gordon .................. | A62C 3/002 106/18.11 |
| 6,112,488 A | * | 9/2000 | Olson ..................... | E04B 1/948 52/167.1 |
| 6,128,874 A | * | 10/2000 | Olson ..................... | E04B 1/948 52/232 |
| 2006/0182915 A1 | * | 8/2006 | Frost ........................ | F16L 57/04 428/36.9 |
| 2008/0196344 A1 | * | 8/2008 | Chang ....................... | B32B 5/02 52/407.1 |

(Continued)

FOREIGN PATENT DOCUMENTS

| | | |
|---|---|---|
| EP | 2 437 363 A1 | 4/2012 |
| EP | 2 457 723 A1 | 5/2012 |
| EP | 2 759 318 A2 | 7/2014 |

OTHER PUBLICATIONS

Oct. 16, 2015 Search Report issued European Patent Application No. 15 16 7608.

*Primary Examiner* — Xiaoliang Chen
(74) *Attorney, Agent, or Firm* — Oliff PLC

(57) ABSTRACT

A rigid electrical panel and a method of manufacturing a rigid electrical panel is provided with a fire protection layer on at least one side. The fire protection layer comprises fibers and an intumescent material. The rigid electrical panel comprises electrical conductors embedded in a rigid organic matrix composite. In the event of a fire, the fire protection layer protects the embedded electrical conductors, and any other features or components carried by the electrical panel.

16 Claims, 6 Drawing Sheets

(56) References Cited

U.S. PATENT DOCUMENTS

2010/0139931 A1\* 6/2010 Guenthner ............ A62C 2/065
  169/48

2010/0144226 A1\* 6/2010 Guenthner ............ A62C 2/065
  442/139
2013/0186033 A1\* 7/2013 Thomas ................. D06N 5/003
  52/741.3

\* cited by examiner

FIRE RESISTANT ELECTRICAL PANEL

CROSS-REFERENCE TO RELATED APPLICATIONS

This application is based upon and claims the benefit of priority from British Patent Application Number 1409189.6 filed 23 May 2014, the entire contents of which are incorporated by reference.

BACKGROUND

1. Field of the Disclosure

The present disclosure relates to a fire-resistant electrical panel and particularly, but not exclusively, to a rigid fire-resistant panel that forms part of an electrical harness of a gas turbine engine, and the manufacture thereof.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

In the event of a fire or an overheat event it is important that components and conductors can remain operational for periods of time, e.g. as determined by certification tests.

OBJECTS AND SUMMARY

According to an aspect, there is provided a method of manufacturing a fire-resistant composite electrical panel for use as part of an electrical harness of a vehicle. The method comprises arranging a layered structure (for example, laying a layered structure into a mould). The layered structure comprises a fire protection layer comprising a fibrous material impregnated with an intumescent material. The fire protection layer forms an outer layer of the layered structure. The layered structure comprises a first organic matrix composite layer comprising fibres and resin. The layered structure comprises at least one electrical conductor. The layered structure comprises a second organic matrix composite layer comprising fibres and resin. The at least one electrical conductor is positioned between the first and second organic matrix composite layers. The method comprises curing the layered structure so as to form the fire-resistant composite electrical panel.

According to an aspect, there is provided a fire-resistant composite electrical panel manufactured according to the method as described above and/or elsewhere herein. Such a fire-resistant electrical panel may be provided as part of an electrical system (for example an electrical harness) on a vehicle (for example on a gas turbine engine). The electrical conductor(s) may be said to be embedded in the electrical panel, and thus may be referred to as embedded electrical conductors.

Accordingly, a composite electrical panel may be manufactured that has a fire protection layer on at least one side of the panel. The fire protection layer may be said to be integral with the rest of the panel after the curing step. The composite electrical panel may be said to have at least one (for example a plurality of) electrical conductors embedded therein. The fire protection layer may ensure that the panel is sufficiently protected in the event of a fire. For example, the fire protection layer may ensure that the electrical conductors embedded in the panel are sufficiently protected in the event of a fire. The fibrous material in the fire protection layer may interact with the intumescent material in order to form a char in the event of a fire. This char may protect the rest of the electrical panel from fire/heat damage, for example by providing an insulating and/or protective layer.

The electrical panel as described and/or claimed herein may allow multiple electrical conductors to be protected against fire. For example, the fire protection layer may protect all of the electrical conductors that are embedded in the electrical panel from fire damage.

Each electrical conductor does not require its own individual protection, as may be the case in a conventional wiring harness.

The organic matrix composite layers may be described as being uncured, pre-cured, or partially cured, when they are arranged in the layered structure, for example in a mould.

The at least one electrical conductor may be provided in any suitable manner. For example, at least one electrical conductor may be provided as part of a flexible printed circuit board. Thus, at least one (for example a plurality of) electrical conductors may be provided as electrically conductive tracks in a flexible substrate. The flexible printed circuit may be flexible before the organic matrix composite layers are cured around it.

Providing the electrical conductors as tracks in a flexible printed circuit may allow the size of the resulting electrical panel to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Alternatively or additionally, at least one conductor may be an electrically conductive wire. Such an electrically conductive wire may be surrounded by an electrically insulating sleeve.

Any given electrical panel may be provided with one or more electrical wires embedded therein (which may be sheathed) and/or one or more flexible printed circuits embedded therein. As such, a given electrical panel may have wires and flexible printed circuits laid therein.

The method of manufacturing the fire-resilient composite electrical panel may or may not comprise interim curing steps during the process. For example, the fire protection layer and the first organic matrix composite layer may be arranged together (without any electrical conductors or the second organic matrix composite layer) and cured in a first (or interim) curing step to form an intermediate base part. The at least one electrical conductor and the second organic matrix composite layer may then be arranged on the intermediate base part prior to the step of curing the layered structure to form the fire-resistant composite electrical panel. In that case, the step of curing the layered structure comprising the intermediate base part (which itself is formed from the first organic matrix composite layer and the fire protection layer), the electrical conductor(s) and the second organic matrix composite layer may be referred to as a final curing step.

In general, the layered structure may refer to the arrangement of the panel during construction, for example at the stage before the final curing step. Additionally or alternatively the final fire-resistant composite electrical panel itself may be said to have a layered structure. Thus, the layered structure may be said to exist both before and after the final curing step.

The step of curing the layered structure to form the fire-resistant composite electrical panel may be the only curing step in the method. Accordingly, the fire protection layer, first organic matrix composite layer, at least one electrical conductor, and second organic matrix composite layer may all be cured for the first (and only) time at the same time.

The first organic matrix composite layer may comprise any suitable number of plies of fibre and resin material, for example in the range of from 2 to 20 plies, for example 3 to 15 plies, for example 4 to 12 plies, for example 8 plies. The second organic matrix composite layer may comprise any suitable number of plies of fibre and resin material, for example in the range of from 1 to 10 plies, for example 2 to 5 plies. The first organic matrix composite layer may, for example, comprise a greater number of plies than the second organic matrix composite layer.

The layered structure may be formed by laying the layers into a mould. The fire protection layer may be laid directly into the mould. In other words, the fire protection layer may be the first (or lower) layer that is laid into the mould. Additionally or alternatively, the fire protection layer may be the last (or upper) layer that is laid into the mould.

The fire protection layer may be impregnated with resin, in addition to the intumescent material. The resin may be the same resin used in the organic matrix composite or may be a different resin. The resin may help to bond the fire protection layer to the organic matrix composite during curing. However, the fire protection layer may not be impregnated with the resin in some cases.

Regardless of whether or not a mould is used, the layered structure may be said to be a thin panel having two opposing major surfaces, one or both of which is formed by a fire protection layer. Accordingly, the resulting fire-resistant composite electrical panel may be provided with fire protection (from the fire protection layers) on its upper and/or its lower surface.

The fire-resistant composite electrical panel may comprise at least one electrical connector (or socket) connected to the at least one electrical conductor. Accordingly, the method of manufacturing the fire-resistant composite electrical panel may comprise connecting at least one electrical connector to the at least one electrical conductor. The electrical connector or socket may allow electrical connection of the electrical panel to other electrical components, for example to other electrical panels (either directly or indirectly, via an electrical cable or lead, which may be a flexible printed circuit) or to electrical units (again, either directly or indirectly, via an electrical cable or lead, which may be a flexible printed circuit) or other parts of an electrical harness. Such an electrical connector or socket may take any suitable form.

Where an electrical connector is provided to the electrical panel, it may be embedded in the organic matrix composite material (for example in the second layer thereof) so as to become part of the layered structure prior to the step of curing.

The fire-resistant composite electrical panel may comprise at least one passage in one or both of the organic matrix composite layers. The or each passage may be for passing a fluid therethrough in use. The method of manufacturing the fire-resistant composite electrical panel may comprise forming at least one passage in one or both of the organic matrix composite layers. The fluid passage may be part of a fluid system, such as a gas (for example pneumatic or cooling gas/air) and/or liquid (for example a fuel, hydraulic and/or lubricant liquid). Accordingly, the electrical panel may be able both to transmit electrical signals/power and carry fluids, for example around a gas turbine engine. Accordingly, the single panel may be able to replace both fluid pipes and individual electrical wires of conventional fluid and electrical systems of a gas turbine engine.

The fire-resistant composite electrical panel may comprise a conductive screen layer, such as a mesh, for example a metallic mesh, such as a copper mesh. The conductive screen layer may be an electromagnetic shield. The conductive screen layer may provide protection to the electrical conductor(s) in the electrical panel, for example from electromagnetic surges, for example from lightning strike. The method of manufacturing a fire-resistant composite electrical panel may thus comprise arranging a conductive screen layer (for example in the form of a mesh) in the layered structure prior to curing. Such a screen layer may be provided in any suitable location in the layered structure/electrical panel, for example between the first organic matrix composite layer and the one or more conductors.

The first and/or second organic matrix composite layers may, after curing, produce rigid composite layers. Such rigid composite layers may be particularly stiff and/or lightweight. The first and/or second organic matrix composite layers may comprise any suitable combination of matrix (or resin) and fibres. For example, any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

A fire-resistant composite electrical panel may be formed in any desired shape, for example in a shape that corresponds to the shape of a casing of a gas turbine engine, such as a fan case, a compressor case, or a turbine case. The method of manufacturing a fire-resistant composite electrical panel may comprise arranging the layered structure in a mould that corresponds to the shape of a casing of a gas turbine engine. In this regard, the term "corresponds to" may mean, for example, that the shape of the electrical panel is an offset shape from the shape of the casing. The fire protection layer may be provided at least to a surface that faces the casing in use.

According to an aspect, there is provided a gas turbine engine comprising at least one fire-resistant composite electrical panel manufactured according to the method as described above and/or elsewhere herein. The or each fire-resistant composite electrical panel may form at least a part of an electrical harness of the gas turbine engine. There is also provided a method of assembling an electrical panel assembly such a gas turbine engine. The method comprises preparing an electrical panel as described above and elsewhere herein. The method also comprises electrically and mechanically connecting the prepared electrical panel to the rest of the gas turbine engine.

An electrical panel may be provided in any suitable location/position of a gas turbine engine. For example, the gas turbine engine may comprise a bypass flow duct formed between an engine core and an engine fan casing (the gas turbine engine may be a turbofan engine, for example); and the electrical panel may form at least a part of a radially extending splitter (which may be referred to as a bifurcation) that extends across the bypass flow duct. In this way, an electrical panel (which may be referred to as a splitter electrical panel) may provide an electrical connection between a fan casing and an engine core. As explained elsewhere herein, one or more electrical panels may be attached to the engine core case or engine fan case, for example to a mounting structure on such cases.

The electrical panel (including the fire-resistant composite electrical panel) may be referred to herein as a rigid electrical panel (or a rigid fire-resistant composite electrical panel), an electrical raft, a rigid raft, a rigid panel, a rigid electrical raft or simply as a panel or a raft. These terms may be considered to be interchangeable as used herein, and so, for example, any feature described in relation to an electrical raft, a rigid raft, a rigid electrical raft, a panel or a raft (or assemblies thereof) may, of course, apply to an electrical panel (including a fire-resistant composite electrical panel). Furthermore, the panel/raft may be at least a part of an electrical harness for a gas turbine engine, and thus may be referred to herein as an electrical harness raft or electrical harness panel.

In general, transferring electrical signals using the embedded electrical conductors of the rigid panel can provide a number of advantages over transferring electrical signals using a conventional harness. For example, during assembly and in use, such panels may provide greater protection to their electrical conductors than conventional harnesses. Further, the use of such panels may significantly reduce the build and maintenance times of an engine, and/or reduce the possibility of errors occurring during such procedures. The panels can also provide weight and size advantages over conventional harnesses. Similar advantages accrue when fluids are transferred using an embedded fluid system of the rigid panel, for example in the form of fluid passages formed in one or more of the organic matrix composite layers as described above.

The fire protection layer may help to maintain the operational effectiveness of the raft/panel in the event of excess heat and/or may help the panel to continue to support the weight of any units mounted to the panel.

In general, the use of one or more electrical rafts/panels may significantly reduce build time of an engine. For example, use of electrical rafts/panels may significantly reduce the part count involved in engine assembly compared with a conventional harness arrangement. The number and/or complexity of the operations required to assemble an engine (for example to assemble/install an electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical panels/electrical panel assemblies, which themselves may be straightforward to handle, position, secure and connect. Thus, use of electrical rafts/panels in a gas turbine installation may reduce assembly time and/or reduce the possibility of errors occurring during assembly.

Use of electrical rafts/panels may provide significant advantages during maintenance, such as repair and overhaul. As discussed above, the electrical panels may be particularly quick and straightforward to assemble to an engine. The same advantages discussed above in relation to assembly apply to disassembly/removal from the gas turbine engine. Thus, any repair/overhaul that requires removal of at least a part of the electrical harness may be simplified and/or speeded up through use of electrical panels as at least a part of the electrical harness, for example compared with conventional harnesses. Use of electrical panels may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical panel, for example by simply disconnecting it from the engine and any other electrical panels/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical panels and/or electrical panel assemblies prior to engine assembly. This may allow the electrical and/or mechanical operation of the electrical panels to be proven before installation, thereby reducing/eliminating the testing required during engine installation.

The electrical rafts/panels may be a particularly lightweight solution for transferring electrical signals around an engine. For example, an electrical panel may be lighter, for example significantly lighter, than a conventional harness required to transmit a given number of electrical signals. A plurality of conductors may be embedded in a single electrical panel, whereas in a conventional arrangement a large number of heavy, bulky wires, usually with insulating sleeves, would be required. The reduced weight may be particularly advantageous, for example, when used on gas turbine engines on aircraft.

Electrical rafts/panels may be more easily packaged and/or more compact, for example than conventional harnesses. Indeed, as mentioned above, the electrical panels can be made into a very wide range of shapes as desired. This may be achieved, for example, by manufacturing the electrical panels using a mould conforming to the desired shape. As such, each electrical panel may be shaped, for example, to turn through a tighter corner (or smaller bend radius) than a conventional harness. The electrical panels may thus provide a particularly compact solution for transferring electrical signals around a gas turbine engine. The electrical panels may be readily shaped to conform to neighbouring components/regions of a gas turbine engine, for example components/regions to which the particular electrical panel assembly is attached, such as a fan casing or a core casing as noted elsewhere herein.

The electrical panel(s) may provide improved protection to the electrical conductors during manufacture/assembly of the panel/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

It will be appreciated that the embedded electrical conductors (whether they are provided as embedded electrical wires or as conductive tracks in a flexible printed circuit embedded in the rigid material) may be described as being fixed in position by the rigid composite material, for example relative to the rest of the electrical harness raft/panel. It will also be appreciated that the embedded electrical conductors may be said to be surrounded by the rigid composite material and/or buried in the rigid composite material and/or integral with (or integrated into) the rigid composite material.

Other components/systems, for example of a gas turbine engine, may be provided to an electrical panel in any suitable manner. For example, such other components/systems may be mounted on an electrical panel after the step of curing the panel. Thus, a surface of an electrical panel may be used as a mounting surface for other gas turbine engine components/systems, such as ancillary/auxiliary components/systems.

For example, an electrical unit may be mounted on an electrical raft/panel. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft/panel to produce an electrical panel assembly. Such an assembly may be a particularly convenient, lightweight and/or compact way of providing (for example attaching, fixing or mounting) an electrical unit to a turbine engine. For example, the electrical unit and the electrical panel may be assembled together (mechanically and/or electrically) before being installed on the gas turbine engine.

An electrical raft/panel may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. Such a mount or bracket may be provided before or after curing the layered structure. The electrical raft/panel may provide a stable, regular and convenient platform on which to mount the various systems/components. The combination of the installed electrical panel assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft/panel (and thus to the engine) as required. For example, fluid pipes for transferring fluid around the engine may be mounted to the electrical rafts/panels (for example mechanically mounted using a bracket), and thus to the engine. More than one set of fluid pipes, for example for carrying different or the same fluids, may be mounted on the same electrical raft/panel.

An anti-vibration mount may be used to attach an electrical raft/panel to another component, thereby allowing the electrical raft/panel to be vibration isolated (or at least substantially vibration isolated). Such an anti-vibration mount may be added to the layered structure prior to curing or added to the cured structure afterwards. Using an anti-vibration mount to attach an electrical raft/panel to a gas turbine engine for example may reduce (or substantially eliminate) the amount (for example the amplitude and/or the number/range of frequencies) of vibration being passed to the electrical raft/panel from the gas turbine engine, for example during use. This may help to prolong the life of the electrical raft/panel. Furthermore, any other components that may be attached to the electrical raft/panel (as discussed above and elsewhere herein) may also benefit from being mounted to the gas turbine engine via the anti-vibration mounts, through being mounted on the electrical raft/panel. For example, the reduced vibration may help to preserve the electrical contact between the electrical raft/panel and any electrical unit connected thereto. As such, any components (such as an electrical unit mounted to the electrical panel) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft/panel (for example to a mounting surface of the electrical panel), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

In use, the electrical signals transferred by the conductors in the electrical raft/panel, and around the engine where the panel is used as part of an electrical harness of a gas turbine engine, may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft/panel may be used to transfer/communicate any possible combination of electrical signals in any part of a gas turbine engine installation or a related (for example electrically and/or mechanically connected) structure/component/system.

BRIEF DESCRIPTION OF THE DRAWINGS

Embodiments will now be described by way of non-limitative example with reference to the accompanying drawings in which.

DETAILED DESCRIPTION OF EMBODIMENTS

Figure 1:
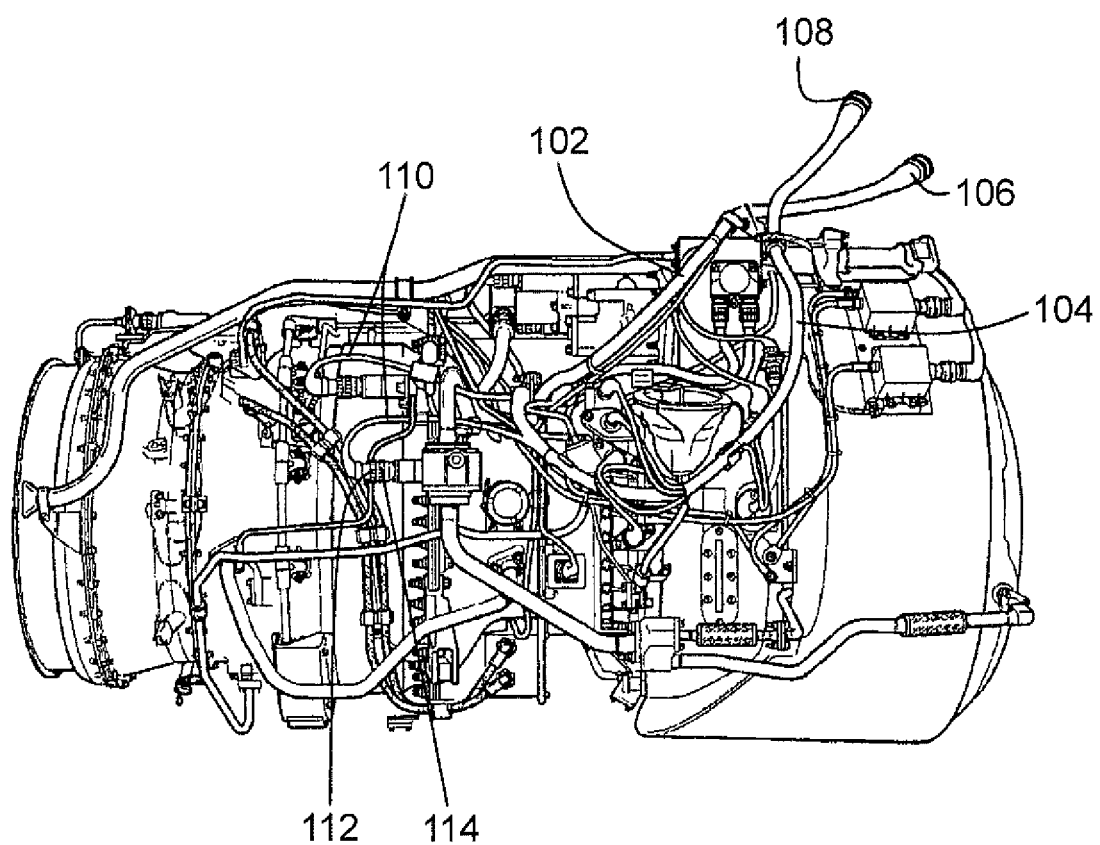
FIG. 1 shows a gas turbine engine with a conventional harness.
Figure 2:
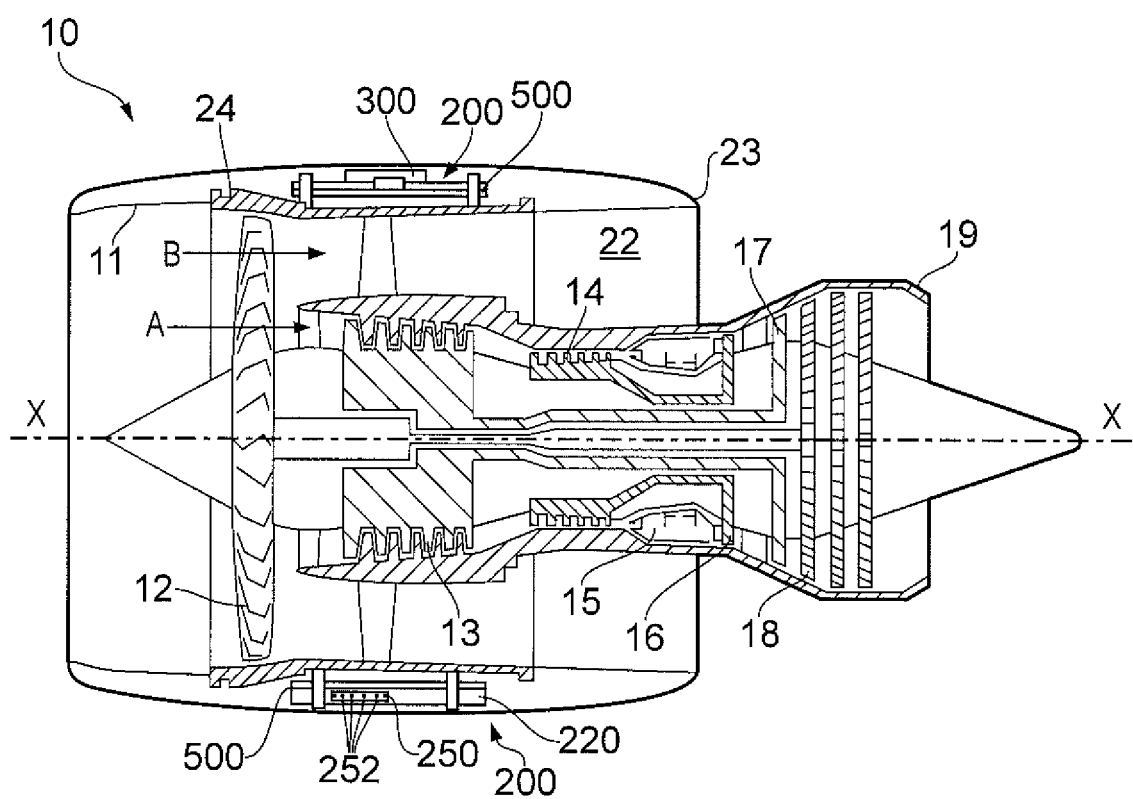
FIG. 2 shows a cross-section through a gas turbine engine having electrical panels in accordance with the present disclosure.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical panels 200 according to the disclosure. As such, the gas turbine engine 10 is in accordance with the present disclosure. Each electrical panel 200 may be referred to as a fire-resistant composite electrical panel. The electrical panels 200 may be rigid electrical panels 200. The electrical panels 200 may be used to transmit/transfer electrical signals (or electricity, including electrical power and/or electrical control signals) around the engine and/or to/from the engine 10 from other components, such as components of an airframe. The function and/or construction of each electrical panel 200 may be as described above and elsewhere herein.

In FIG. 2, each electrical panel 200 comprises at least one electrical conductor 252 embedded in a rigid material 220, which may be a rigid composite material. The electrical conductors 252 in the electrical panel 200 may be provided in a harness 250, which may be a flexible printed circuit board (or FPC) 250. Each electrical panel 200 also comprises a fire protection layer 500. One of the electrical panels 200 is provided with an electrical unit 300 mounted thereon. The electrical unit 300 may be electrically connected to the electrical conductors 252 in the electrical panel 200.

Figure 5:
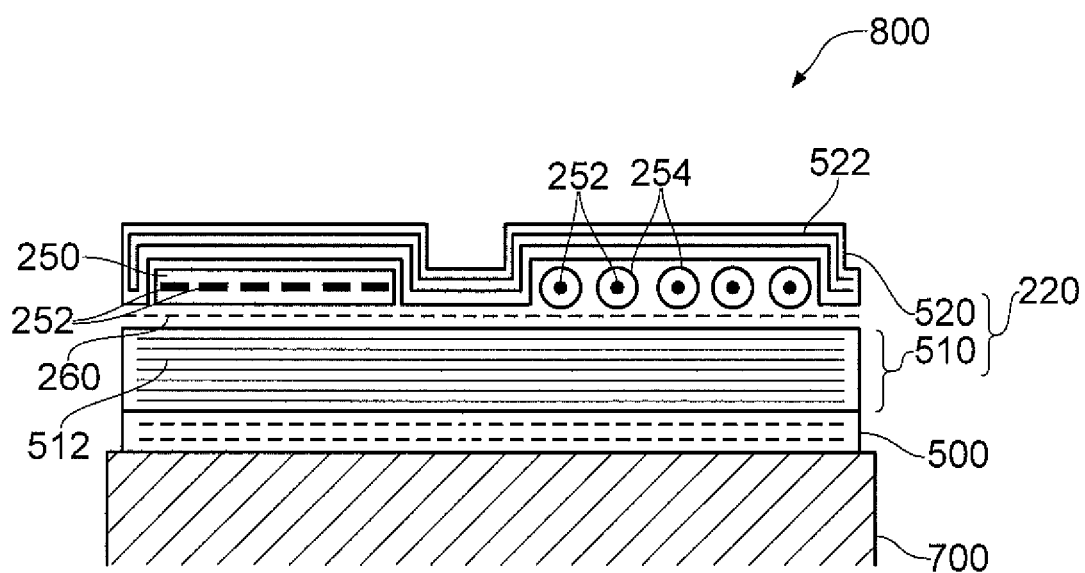
FIG. 5 shows a cross-section through an example of an electrical panel laid onto a mould.
Figure 6:
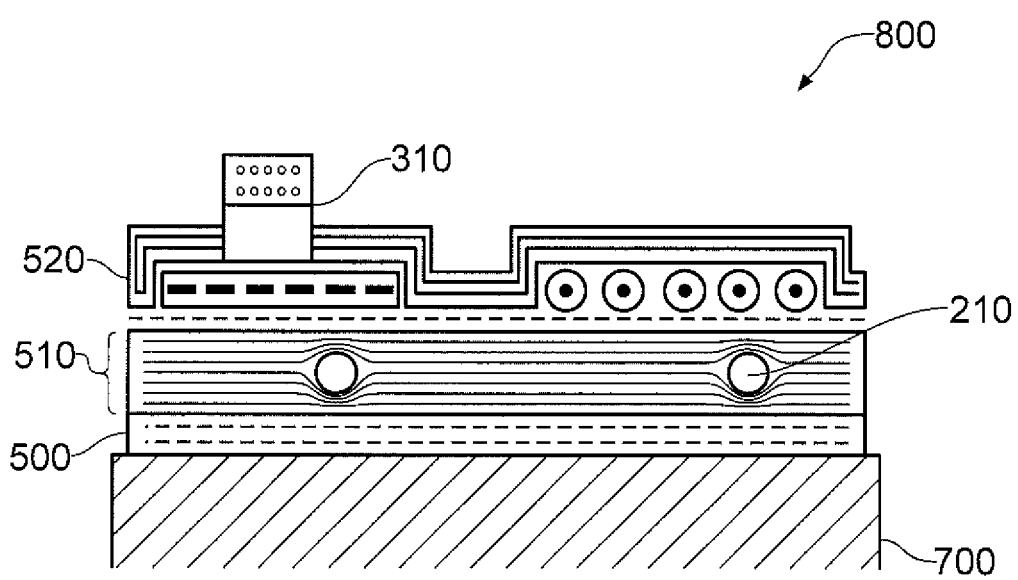
FIG. 6 shows a cross-section through an example of another electrical panel laid onto a mould.

Further exemplary details of an electrical panel 200, and a method of manufacturing an electrical panel 200, are provided in relation to FIGS. 5 and 6.

Figure 3:
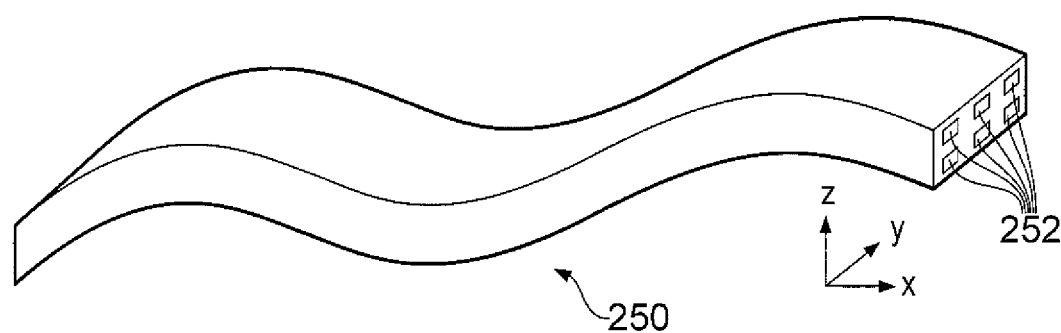
FIG. 3 shows a perspective view of a flexible printed circuit.
Figure 4:
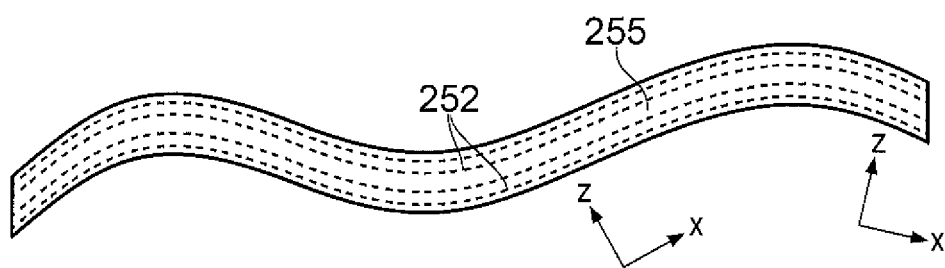
FIG. 4 shows a side view of the flexible printed circuit of FIG. 3.

An example of an FPC 250 in which the electrical conductors 252 may be provided is shown in greater detail in FIGS. 3 and 4. FIG. 3 shows a perspective view of the FPC 250, and FIG. 4 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 3 and 4, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 4. The x-y surface(s) (i.e. the surfaces formed by the x and y directions) may be said to be the major surface(s) of the FPC 250. In the example shown in FIGS. 3 and 4, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the electrical panel 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 3 and 4 has six conductive tracks 252 running through the substrate 255. However, the number of conductive tracks 252 running through a substrate 255 could be fewer than six, or greater than six, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 3 and 4 comprises 2 layers of tracks, with each layer comprising 3 tracks 252.

FIG. 5 shows a layered structure 800 laid on a tool or mould 700 during manufacture, and clearly shows layers that are included in the manufacture of an electrical panel 200. An electrical panel 200 may be manufactured by curing the layers of the layered structure 800. Accordingly, the layers of the layered structure 800 may form layers of an electrical panel 200.

In the FIG. 5 arrangement, a fire protection layer 500 is laid onto the mould 700, thereby forming an outer surface of the electrical panel 200. A first organic composite layer 510 is then provided on top of the fire protection layer 500. Electrical conductors 252 are provided on top of the first organic composite layer 510, for example in the form of a flexible PCB 250 or individual wires 254. A second organic composite layer 520 is provided on top of the electrical conductors 252. Accordingly, the electrical conductors 252 are positioned between the first and second composite layers 510, 520. After curing, the first and second organic composite layers 510, 520 may form the rigid material 220 of the electrical panel. The electrical conductors 252 may then be said to be embedded in the rigid material 220.

Additional layers may be provided to the layered structure 800. For example, additional layers may be added between the two first and second organic composite layers 510, 520, such as a conductive screen layer 260 as in the FIG. 5 example. Such a conductive screen layer 260 may provide electromagnetic screening for the electrical conductors 252 in use. Adhesive layers (not shown), for example adhesive films, may be provided between layers of the layered structure 800. For example, an adhesive layer may be provided on one or both sides of the electrical conductors 252.

The fire protection layer 500 comprises an intumescent material. The fire protection layer 500 also comprises a fibrous material, such as mineral fibres which may be resistant to degradation at high temperatures, such as would be experienced during a fire. The fibres may take any suitable form, such as chopped fibres, elongate fibres and/or continuous fibres extending through the fire protection layer 500. In the event of a fire, the intumescent material 500 expands to form a protective char. The fibres may act to stabilize the char, ensuring that it provides an effective and consistent protection against fire.

The fire protection layer 500 may itself be provided with resin. The resin may help to bond the fire protection layer to the rest of the layered structure 800, for example to the first organic matrix composite layer 510. Alternatively, the fire protection layer 500 may not be provided with its own resin. In that case, resin from the first organic matrix composite layer 510 may bond the fire protection layer 500 to the rest of the layered structure.

In FIG. 5, the fire protection layer is shown as being the "first" layer, i.e. the layer that is provided directly onto the tool 700, at the bottom of the stack of the layered structure 800. Alternatively or additionally, a fire protection layer 500 may be provided on the opposing surface of the layered structure 800. That is, a fire protection layer 500 may alternatively or additionally be provided on the second organic matrix composite layer 520. Thus, a fire protection layer 500 may be provided to one or both major surfaces of the electrical panel 200. Still further, a fire protection layer may be provided around all of the layers of the layered structure 800, thereby resulting in an electrical panel 200 that is surrounded by a fibre protection layer comprising a fibrous material impregnated with an intumescent material.

The composite layers 510, 520 may take any suitable form and/or construction. For example, the composite layers 510, 520 may each comprise one or more ply layers (or plies) of resin and fibres, as shown in the example of FIG. 5 by the lines 512, 522.

Such a fibre and resin compound may, after suitable treatment (for example curing, such as heat treatment), produce the rigid composite material 220. The fibres 512, 522 in one ply layer may extend in a different direction to those of another ply layer. For example fibres in one play layer 512, 522 may extend perpendicularly or ay 30 degrees, 45 degrees or 60 degrees to fibres in another ply layer 512, 522 directions. The fibres may be pre-impregnated (or "pre-pregged") with the resin.

Prior to any treatment, such as curing, both the first and second composite layer 510, 520 and the electrical conductors 252 may be flexible, for example supple, pliable or malleable. As such, when the layers 510, 520 and the electrical conductors 252 are placed together, they may be moulded, or formed, into any desired shape. For example, the layers 510, 520 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final panel to adopt shapes that are curved in two-dimensions or three-dimensions. The shape of the tool or mould 700 may be the desired shape of the final electrical panel 200, or a shape that results in the desired shape of the final panel 200 after allowing for some shrinkage during curing.

Any suitable method could be used to produce the rigid material 220 of the electrical panel 200. For example, the strands/fibres of the organic matrix composite layers 510, 520 need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method.

The method of manufacturing an electrical panel 200 from the layered structure 800 comprises curing. The curing could be a single-stage cure, in which all of the layers in the layered structure 800 are cured once at the same time. Alternatively, the curing could be a multi-stage cure, in which at least two of the layers are cured, before additional layers are added and then the layered structure is cured again. For example, the fire protection layer 500 and the first composite layer 510 may be laid together and cured before the electrical conductors 252 and the second composite layer 520 are added. In that case, the cured fire protection layer 500 and first composite layer 510 may provide a rigid, stable platform on which to lay the electrical conductors 252 and the second composite layer 520 before final curing of the layered structure 800.

The layered structure 800 shown in FIG. 5 has two organic matrix composite layers 510, 520, but other layered structures 800 (and electrical panels 200 resulting therefrom) may have additional organic matrix composite layers, for example 3, 4, 5 or more than 5 organic matrix composites layers.

The electrical panel 200 may comprise additional components and/or parts, for example components/parts that might form part of a conventional engine dressing. Such components may, for example, comprise parts of fluid and/or electrical systems of a gas turbine engine, such as one or more fluid passages and/or one or more electrical connectors.

FIG. 6 is an example of a layered structure 800 that, after curing, would result in an electrical panel 200 comprising an electrical connector 310 and a fluid passage 210. In other respects, the layered structure 800 of FIG. 6 is substantially the same as the layered structure 800 of FIG. 5, and like features are given like reference numerals.

FIG. 6 shows two fluid passages 210, although an electrical panel 200 may comprise any number of fluid passages, or indeed no fluid passages as in the FIG. 5 example. The different fluid passages 210 may carry the same or a different type of fluid, such as any of the fluids described elsewhere herein by way of example. The fluid passages 210 may form part of fluid systems of a gas turbine engine, for example. The fluid passages 210 are shown in FIG. 6 as being formed in the first organic matrix composite layer 510. Additionally or alternatively, fluid passages 210 may be formed in the second organic matrix composite layer 520, or in other layers of a layered structure 800. Fluid passages 210 may be formed in any suitable manner, for example by laying plies of composite 512 around embedded pipes.

The connector 310 in FIG. 6 is shown for illustrative purposes only, and it will be appreciated that an electrical connector 310 may take any suitable form. For example, the electrical connector 310 may be a male connector or a female connector, having any suitable numbers of pins or receiving holes and any desired form. Although not directly shown in FIG. 6, the electrical connector 310 may be in electrical contact with the embedded conductors 252 (for example in a different plane to that of FIG. 6), thereby allowing the conductors to be connected to other electrical components.

Figure 7:
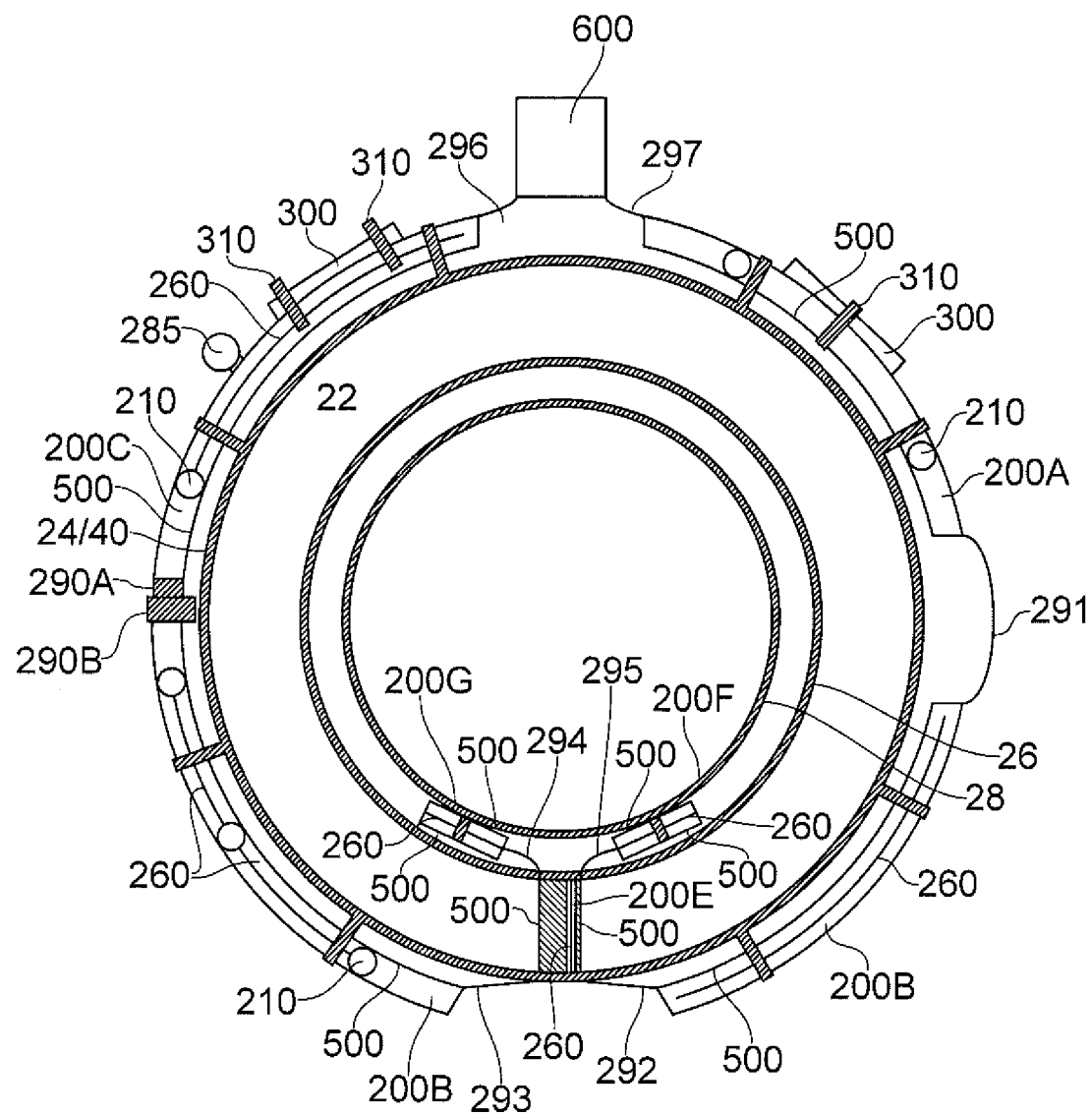
FIG. 7 shows a cross-section normal to the axial direction through a gas turbine engine having electrical panels in accordance with the present disclosure.

FIG. 7 is a schematic showing a cross-section perpendicular to the direction X-X of a gas turbine engine comprising electrical panels 200A-200G. Any one of the electrical panels 200A-200G may comprise any or all of the features of an electrical panel 200 as described above, for example. Thus, for example, any one of the electrical panels 200A-200G may comprise a rigid material 220 formed from first and second organic matrix composite layers 510, 520 having electrical conductors 252 (not labelled in FIG. 7 for simplicity only) embedded therein.

Each of the electrical panels 200A-200G in FIG. 7 is shown as having at least one fire protection layer 500, although it will be appreciated that not all of the electrical panels 200 on a gas turbine engine 10 may have the fire protection layer 500 as described herein depending on, for example, the location of the panel 200 in the engine.

The electrical panels 200A-200D are mounted to a fan case 24, the electrical panel 200E is part of a bifurcation splitter that radially crosses a bypass duct 22, and the electrical panels 200F, 200G are mounted to an engine core case 28. However, it will be appreciated that an electrical panel 200 could be mounted in any suitable and/or desired location on a gas turbine engine 10.

In FIG. 7, two electrical panels 200A, 200C are shown as having an electrical unit 300 mounted thereon. However, any (or none) of the electrical panels 200A-200G may have an electrical unit 300 mounted thereon.

As mentioned herein, each of the electrical panels 200 shown in FIG. 7 comprises one or more electrical conductors 252 embedded therein. However, any one or more of the electrical panels 200 may be replaced with a panel that does not comprise electrical conductors 252. Such a panel (or raft) would not be an electrical panel 200, but may otherwise be as described elsewhere herein, for example it may be a rigid panel that may have components/systems (such as, by way of example only, fluid systems, such as pipes) mounted thereon and/or embedded therein. Thus, for example, a gas turbine engine in accordance with the present disclosure may have a combination of electrical panels 200 and non-electrical panels.

The arrangement of electrical panels 200A-200G shown in FIG. 7 is by way of example only. Alternative arrangements, for example in terms of number, size, shape and/or positioning, of electrical panels 200A-200G may be used. For example, there need not be seven electrical panels 200, the panels may or may not be connected together, and the panels could be provided to (for example mounted on) any one or more components of the gas turbine engine 10. Purely by way of example only, connection between electrical panels 200A-200D mounted on the fan casing 24 to the electrical panels 200F, 200G mounted on the core casing 28 may be provided at least in part by means other than an additional electrical panel 200E, for example using wire conductors with insulating sleeves. By way of further example, one or more electrical panels 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 600 between the gas turbine engine 10 and an airframe (not shown).

Any one or more of the electrical panels 200A-200G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 7 example, three of the electrical panels 200A-200C comprise a fluid passage 210 at least partially embedded therein. The electrical panel 200C also has a fluid passage 285 (which may be for any fluid, such as those listed above in relation to embedded passage 210) mounted thereon. Such a mounted fluid passage 285 may be provided to any electrical panel 200, such as those shown in FIG. 7. The fluid passages 210, 285 shown in FIG. 7 may be oriented in an axial direction of the engine 10. However, fluid passages 210, 285 may be oriented in any direction, for example axial, radial, circumferential or a combination thereof.

Any of the electrical panels 200A-200G may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 7, and described below, but other connectors may be used. For example, electrical panels 200 (and/or non-electrical panels) may be connected together (or to other components) using any combination of electrical, fluid and/or mechanical connectors. Thus, any of the connections 290A/290B, 291-297 shown in FIG. 7 may be any combination of electrical, fluid and/or mechanical connection. Alternatively, electrical panels 200 (and/or non-electrical panels) may be standalone, and thus may have no connection to other panels or components.

A connection 291 is shown between the electrical panels 200A-200D. The connection 291 may comprise an electrical connection. Such an electrical connection may be flexible and may, for example, take the form of a flexible printed circuit such as the flexible printed circuit 250 shown in FIGS. 3 and 4. Such a flexible electrical connection may be used to electrically connect any electrical panel 200 to any other component, such as another electrical panel 200. A connection 297 (which may be or comprise an electrical connection) is provided between the electrical panel 200A and a part of an airframe, or airframe installation 600, which may, for example, be a pylon. Similarly, a fluid and/or mechanical connection 296 may additionally or alternatively be provided between the airframe 600 and another electrical panel 200C. As shown in FIG. 7, other electrical and/or fluid connections 292, 293, 294, 295 may be provided between electrical panels 200 and other components, such as other electrical panels 200.

A direct connection 290A, 290B may be provided, as shown for example between the electrical panels 200B, 200C. Such a direct connection 290A, 290B may comprise a connector 290A provided on (for example embedded in) one electrical panel 200 connected to a complimentary connector 290B provided on (for example embedded in) another electrical panel 200. Such a direct connection 290A, 290B may, for example, provide fluid and/or electrical connection between the two electrical panels 200B, 200C.

An electrical panel 200 may comprise an electrically conductive grounding or screen layer 260, as shown in electrical panels 200 shown in FIG. 7. However, it will be appreciated that electrical panels 200 according to the invention and/or for use with the invention need not have such an electrically conductive grounding or screen layer 260. Where an electrically conductive grounding or screen layer 260 is present, an electrically conductive fastener 310 may be used to fasten, or fix, an electrical unit 300 (where present) to the electrical panel 200. This may allow the electrical unit 300 to be electrically grounded. It will also be appreciated, however, that electrical panels 200 according to the invention and/or for use with the invention need not have such an electrically conductive fastener 310.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical panels 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments set forth above are considered to be illustrative and not limiting. Various changes to the described embodiments may be made without departing from the scope of the invention.

For example, it will be appreciated that many alternative configurations and/or arrangements of electrical panels 200 and gas turbine engines 10 comprising electrical panels 200 other than those described herein may fall within the scope of the invention. For example, alternative arrangements of electrical panels 200 (for example in terms of the arrangement, including number/shape/positioning/constructions, of mounting fixtures, the arrangement/shape/positioning/construction of the electrical panels 200, the type and/or positioning of components (if any) mounted to/embedded in the electrical panels 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) panels and/or assemblies thereof and between the electrical (or non-electrical) panels and/or assemblies thereof and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A method of manufacturing a fire-resistant composite electrical panel for use as part of an electrical harness of a vehicle, the method comprising:
    arranging a layered structure comprising:
        a fire protection layer comprising a fibrous material impregnated with an intumescent material, the fire protection layer forming an outer layer of the layered structure;
        a first organic matrix composite layer comprising fibres and resin;
        at least one electrical conductor; and
        a second organic matrix composite layer comprising fibres and resin, the at least one electrical conductor being positioned between the first and second organic matrix composite layers,
    the method further comprising curing the layered structure so as to form the fire-resistant composite electrical panel.

2. A method of manufacturing a fire-resistant composite electrical panel according to claim 1, wherein:
    the fire protection layer and the first organic matrix composite layer are arranged together and cured in a first curing step to form an intermediate base part; and
    the at least one electrical conductor and the second organic matrix composite layer are arranged on the intermediate base part prior to the step of curing the layered structure to form the fire-resistant composite electrical panel.

3. A method of manufacturing a fire-resistant composite electrical panel according to claim 1, wherein the step of curing the layered structure to form the fire-resistant composite electrical panel is the only curing step in the method.

4. A method of manufacturing a fire-resistant composite electrical panel according to claim 1, wherein the first organic matrix composite layer comprises between 4 and 12 plies of fibre and resin material, and the second organic matrix composite layer comprises between 1 and 5 plies of fibre and resin material.

5. A method of manufacturing a fire-resistant composite electrical panel according to claim 1, wherein the at least one electrical conductor is part of a flexible printed circuit board.

6. A method of manufacturing a fire-resistant composite electrical panel according to claim 1, wherein the fire protection layer is laid directly into a mould so as to form the first layer of the layered structure.

7. A method of manufacturing a fire-resistant composite electrical panel according to claim 1, wherein the fire protection layer is also impregnated with resin.

8. A method of manufacturing a fire-resistant composite electrical panel according to claim 1, comprising two fire protection layers, with the layered structure being a thin panel having two opposing major surfaces, each of which is formed by a fire protection layer.

9. A method of manufacturing a fire-resistant composite electrical panel according to claim 1, further comprising connecting at least one electrical connector to the at least one electrical conductor.

10. A method of manufacturing a fire-resistant composite electrical panel according to claim 9, wherein the electrical connector is embedded in the second layer of the organic matrix composite material so as to become part of the layered structure prior to the step of curing.

11. A method of manufacturing a fire-resistant composite electrical panel according to claim 1, further comprising forming at least one passage in one or both of the organic matrix composite layers, the or each passage being for passing a fluid therethrough in use.

12. A method of manufacturing a fire-resistant composite electrical panel according to claim 1, further comprising arranging a conductive screen layer in the layered structure prior to curing.

13. A method of manufacturing a fire-resistant composite electrical panel according to claim 1, wherein the first and/or second organic matrix composite layers comprise carbon fibres.

14. A method of manufacturing a fire-resistant electrical panel according to claim 1, comprising arranging the layered structure in a mould that corresponds to the shape of a casing of a gas turbine engine.

15. A fire-resistant composite electrical panel manufactured according to the method of claim 1.

16. A gas turbine engine comprising at least one fire-resistant composite electrical panel according to claim 15, the or each fire-resistant composite electrical panel forming at least a part of an electrical harness of the gas turbine engine.

\* \* \* \* \*